(12) United States Patent
Slavin

(10) Patent No.: US 7,243,290 B2
(45) Date of Patent: Jul. 10, 2007

(54) DATA ENCODING FOR FAST CAM AND TCAM ACCESS TIMES

(75) Inventor: Keith R. Slavin, Beaverton, OR (US)

(73) Assignee: Micron Technology, Inc., Boise, ID (US)

( * ) Notice: Subject to any disclaimer, the term of this patent is extended or adjusted under 35 U.S.C. 154(b) by 581 days.

(21) Appl. No.: 10/616,958

(22) Filed: Jul. 11, 2003

(65) Prior Publication Data

US 2005/0010719 A1    Jan. 13, 2005

(51) Int. Cl.
*G11C 29/00*    (2006.01)
(52) U.S. Cl. .................. 714/763; 714/805; 714/819; 711/108; 365/49
(58) Field of Classification Search .............. 714/768, 714/763; 711/108; 365/49
See application file for complete search history.

(56) References Cited

U.S. PATENT DOCUMENTS

| | | | | |
|---|---|---|---|---|
| 6,842,359 B2 * | 1/2005 | Hata et al. ................. | 365/49 |
| 6,944,710 B2 * | 9/2005 | Regev et al. .............. | 711/108 |
| 6,975,526 B2 * | 12/2005 | Regev et al. .............. | 365/49 |
| 7,002,823 B1 * | 2/2006 | Ichiriu ...................... | 365/49 |
| 7,017,089 B1 * | 3/2006 | Huse ......................... | 714/718 |

* cited by examiner

*Primary Examiner*—Albert Decady
*Assistant Examiner*—Esaw Abraham
(74) *Attorney, Agent, or Firm*—Dickstein Shapiro LLP

(57) ABSTRACT

A method and apparatus for operating a content addressable memory (CAM) and a ternary CAM (TCAM) are described including an encoding circuit for encoding an incoming CAM or TCAM word to produce an encoded CAM or TCAM word such that a one-bit mismatch between a comparand and the incoming CAM or TCAM word results in at least a M-bit mismatch between said encoded CAM or TCAM word and a similarly encoded comparand, a circuit for precharging a match line to a predetermined state before a comparison between the encoded CAM or TCAM word and said similarly encoded comparand and a memory storage location for storing the encoded CAM or TCAM word.

56 Claims, 8 Drawing Sheets

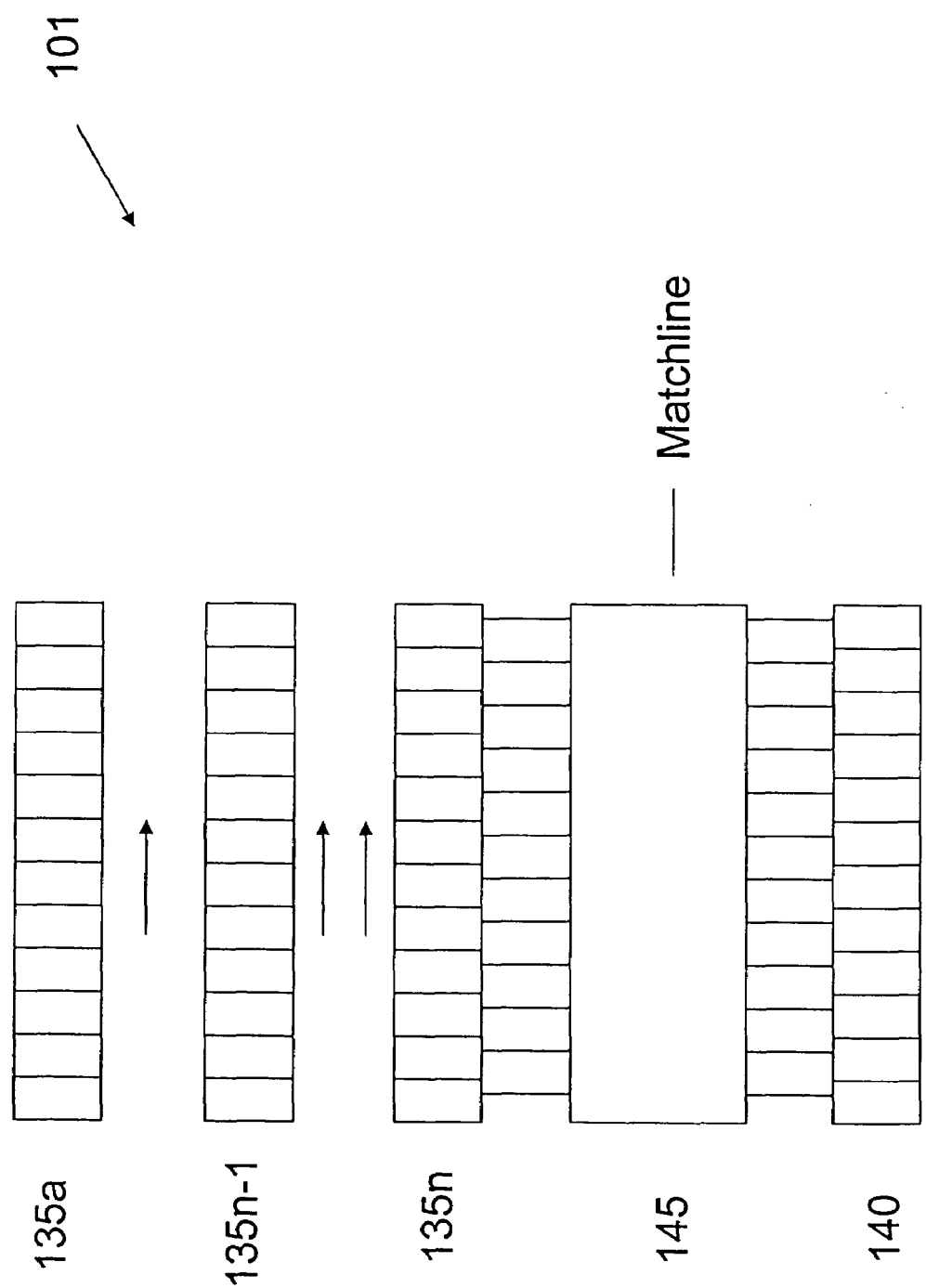

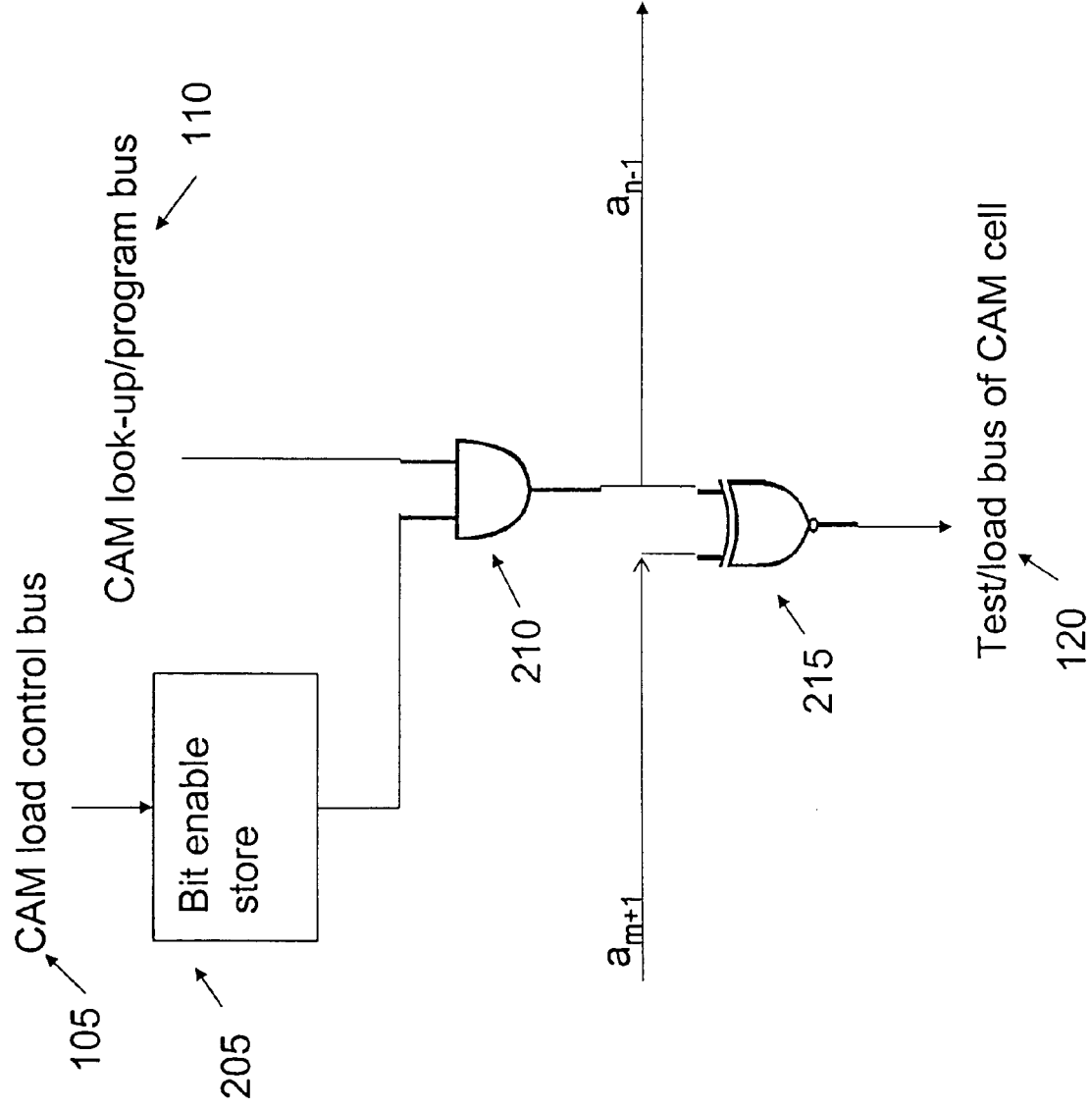

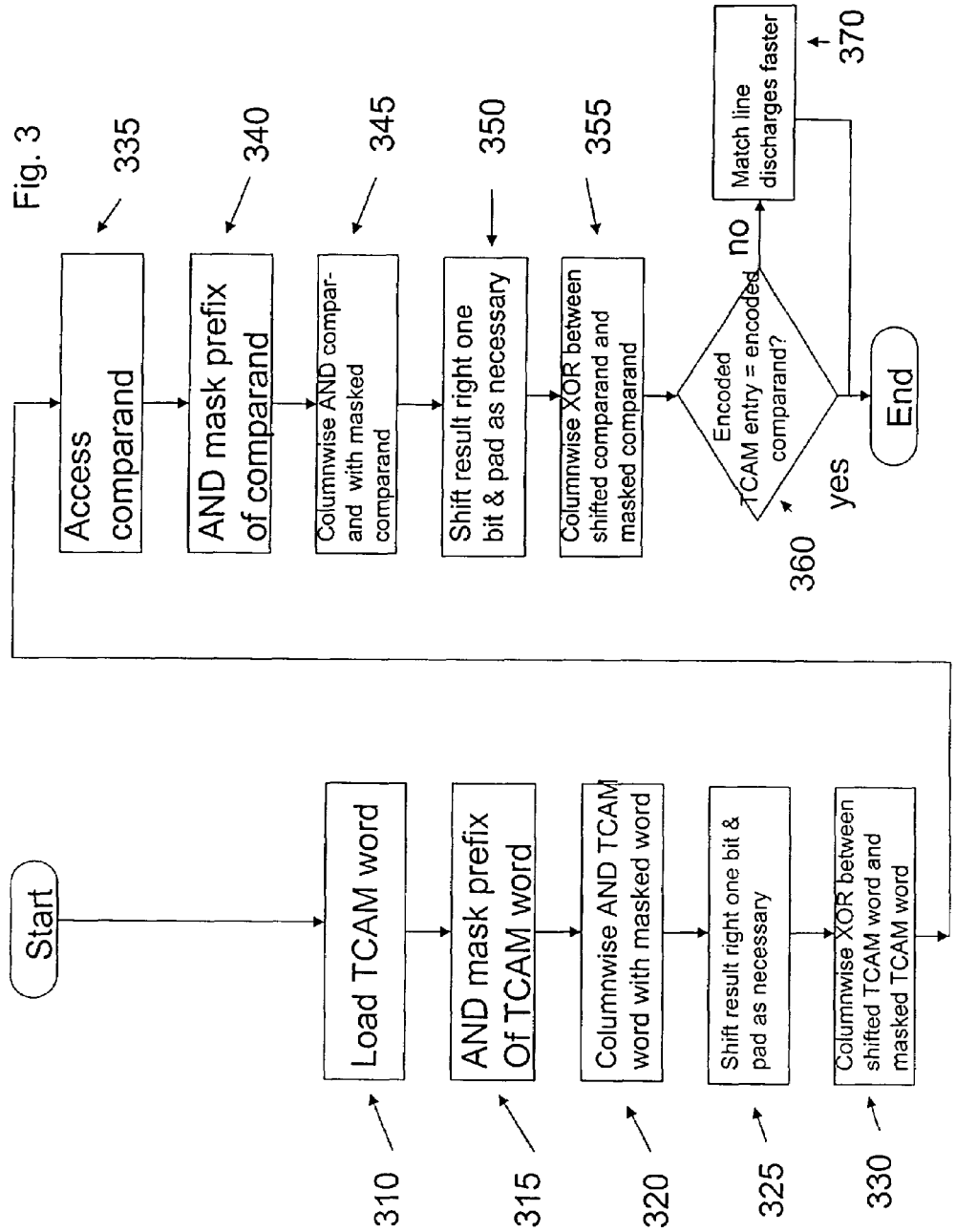

US 7,243,290 B2

DATA ENCODING FOR FAST CAM AND TCAM ACCESS TIMES

FIELD OF THE INVENTION

The present invention relates generally to a content addressable memory (CAM) device and a Ternary CAM (TCAM) device, and more particularly, to a system and method for increasing the speed in which a mismatch is detected.

BACKGROUND OF THE INVENTION

An essential semiconductor device is a semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in a comparand register) against the entire list of pre-stored entries. As a result of their unique searching algorithm, CAM devices are frequently employed in network equipment, particularly routers, gateways and switches, computer systems and other devices that require rapid content searching, such as routing data or tables for data networks or matching URLs. The CAM words are loaded into the CAM by a system controller. These fixed tables reside in the CAM for a relatively long period of time. A word in a CAM is typically large and can be 96 bits or more.

In order to perform a memory search in the above-identified manner, CAMs are organized differently than other memory devices (e.g., DRAM and SRAM). For example, data is stored in a RAM in a particular location, called an address. During a memory access, the user supplies an address and reads or writes the data at the specified address. Every memory storage location contains a match word part and additional data associated with each match word, such as an output port routing index in a network. It may also store a bit to indicate whether the match word participates in the networking process.

Once information is stored in a memory storage location, it is located by comparing every bit stored in the match word part with data in a comparand register. When the contents stored in the CAM match word do not match the data in the comparand register, a local match detection circuit returns a "mismatch" indication. When the contents stored in the CAM match word match the data in the comparand register, the local match detection circuit returns a "match" indication. If one or more local match detect circuits return a match indication, the CAM device returns a "match" indication. Otherwise, the CAM device returns a "no-match" indication, usually with a priority encoding scheme to return the address of the most desirable match and it associated data. The most desirable match may be the highest address or the lowest address in the CAM device. If the CAM match word does not match the data in the comparand register, then the CAM device returns a "mismatch" indication. In addition, the CAM may return the identification of the address/memory storage location in which the desired data is stored or one of such addresses, such as a highest priority match address, if more than one corresponding CAM storage location contained matching data. Thus, with a CAM, the user supplies the data and receives the address if a match is found in memory.

For high CAM look-up throughput rates, the incoming data is compared with all CAM entries in parallel, resulting in high power consumption. In some power saving schemes, individual entries can be programmed to never match, or banks of entries can be enabled or disabled.

TCAMs are similar to CAMs except that each bit can also be programmed to match a 'don't care' or X value. When an incoming TCAM data word is compared with an entry, each match bit in an entry can be programmed to be one of a (0,1,X), where X is a 'don't care' match value that matches a 0 or 1 in the corresponding bit on the incoming TCAM word. Of course, all the other bits in a word have to match according to the (0,1,X) pattern before a TCAM word match occurs. For example, programming a TCAM entry with all X's causes the entry to match all possible inputs.

With each CAM or TCAM word match, time consuming electrical events occur. The first event is the pre-charging of each match line associated with a CAM storage location to indicate a match. Then the match between the bits of the incoming word/comparand and the bits of each CAM storage location occurs. If even only one CAM bit in the comparand fails to match a corresponding bit in a CAM entry, then the corresponding match line is discharged to indicate a mismatch at that entry. A match line is typically connected to many match circuits, so is relatively long and has significant wire and circuit loading capacitance. If M bits in a CAM word don't match the comparand, then the match line is discharged through M circuits, each able to drain a certain amount of current. If M=1, then the discharge is the slowest mismatch case. The resulting match voltage level is then sampled at a safe time for this worst-case discharge timing to occur. As a result, a CAM is relatively slow memory device.

SUMMARY OF THE INVENTION

Embodiments of the present invention address the above-identified shortcomings by using a novel approach to speed up CAM access by coding the comparand and incoming CAM words into redundant representations (stored in the comparand and the CAM storage locations) using error correcting codes, such that coded words are different by a minimum number of bits. Comparands for matching are similarly encoded so that they either match a word in a CAM storage location completely or mismatch with a minimum of bits (>1) of difference. In one embodiment, the increased number of bits of difference changes CAM matching lines to a mismatch state much more quickly than a worst-case of a single pull-down transistor for a one bit mismatch in a conventional CAM. A modified approach can be applied to TCAMs.

The Hamming Distance is a simple measure of the number of bits that differ between two binary words. In the case of a coded set of binary words, the Hamming Distance is the smallest number of bits that differ between any pair of words within the set. A set with a Hamming Distance of one allows all possible binary code values in the set, for example (but no repeated code-words). A Hamming Distance of two implies that a single change in a coded word is guaranteed to be at least one bit different from a legitimate code word, and, thus, can be detected. In a CAM search, using encoded data stored in CAM storage locations and the comparand, if a search of the unencoded data would result in a match, a search of the encoded data using an encoded comparand would similarly result in a match; if a search of the unencoded data would result in a mismatch in one bit, then a search of the encoded data using and encoded comparand would result in a mismatch in an increased number of bits corresponding to the Hamming distance. This has the effect of improving CAM access times by decreasing the time to change the state of the match line.

The price paid for using codes with a Hamming Distance greater than one, is that for an input of k bits, with $2^k$ possible values, the error correcting code maps to a code of M bits, where M is greater than k. The value (M−k)/k is the fractional overhead of the code. Each coded word in the coded set corresponds to exactly one and only one input code word, but each coded word is represented by M bits. The extra bits are required for the coded words to have an increased Hamming Distance. The best codes, such as the well-known BCH codes, space code words efficiently, so M is the smallest possible for a given k and Hamming Distance. However, many other methods of generating codes may exist that can generate code sets with Hamming distances greater than one.

In an embodiment, incoming CAM words are encoded by loading the incoming CAM words via a load control bus. The prefix of each of the loaded CAM words is masked as is the prefix of the comparand. The masked CAM words and the masked comparand are shifted right and padded as necessary. Padding is accomplished by adding one or more bits to the end of each shifted CAM word and the shifted comparand. Each shifted (and padded) CAM word is subjected to an exclusive OR wire-or function with precharge (XOR-WOR) with the masked CAM word. The shifted (and padded) comparand is similarly XOR-WOR'ed with the masked comparand. The thus encoded CAM words are stored in CAM memory storage locations. Once the CAM words and comparand have been encoded, then a search/match operation is performed.

BRIEF DESCRIPTION OF THE DRAWINGS

FIG. 1C is an exemplary embodiment of a CAM of the invention in functional block form;

FIG. 2 is a detailed diagram of one bit of the CAM parity coding circuit of an embodiment of the invention;

FIG. 3 is a flowchart of one method of the invention used for TCAM devices;

DETAILED DESCRIPTION OF THE INVENTION

Figure 1A:
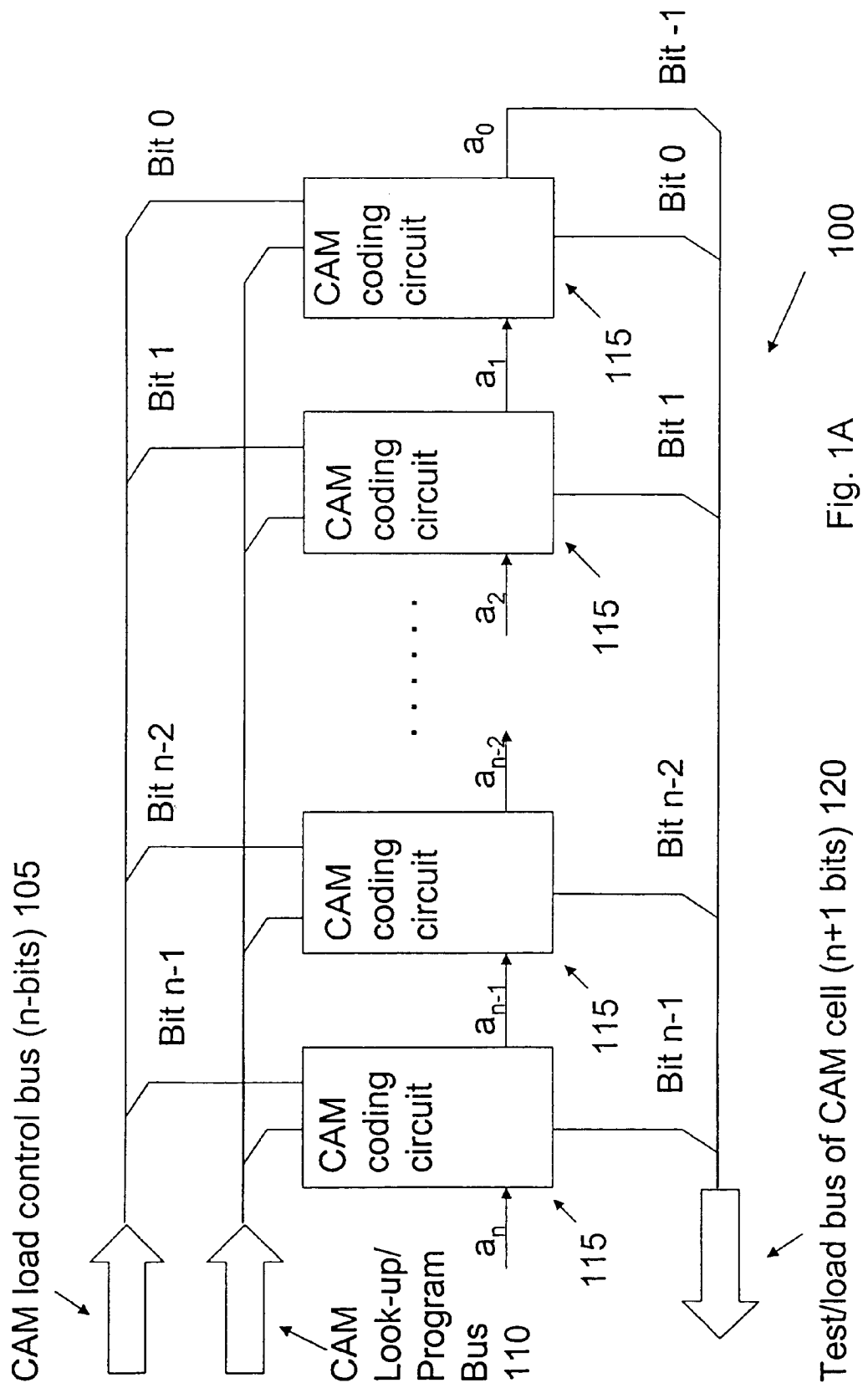
FIG. 1A is an n-bit CAM parity coding circuit of an embodiment of the invention.

A novel way to speed up CAM access is to guarantee that in any CAM word mismatch, more than one bit mismatches (M>1) are bound to occur. For example, if M=2, then the mismatch distance will be almost twice as fast as for M=1, as long as the match line itself is not significantly increased in its capacitance as a result.

Block error detecting/correcting codes such as the well known Bose-Chaudhuri Hocquenghem (BCH) error correcting codes (based on Galois Fields), allow the construction of reasonably efficient encoded sets with any desired Hamming Distance. To correct e-bit errors on a code word, a Hamming Distance of H=2e+1 is required, otherwise the erroneous word will be interpreted as being closer to another code word, resulting in a residual error after "correction". In the present invention, the error correction capability provided by the encoding is not used; rather, only the encoding process to provide Hamming distance between encoded words is of interest.

For BCH codes, starting with B bits for each word in the original (unencoded) comparison domain, and encoding the bits so that the corresponding code words have a Hamming Distance of H, then a code with M bits (M>B) satisfying the following BCH code constraint is required:

$$M=B+eR<2^R \qquad \text{(Eq. 1)}$$

For R>e+1.

Assuming e>0, then a lower limit (starting value for a search) on R is given by R=ceil $\log_2$ B+1, where ceil is a function that returns the smallest integer value greater than or equal to the argument of the function. There is no closed form solution for the smallest value of R, but it can easily be found numerically, knowing B and e.

For example, if B=128=$2^7$ bits, starting with R=ceil($\log_2$ $2^7$)+1=8, and if e=1, then C=128+8=136 bits, which is less than $2^8$=256, so Eq. 1 is satisfied immediately. This represents an increasing code size of 8/128 or 6.25% in the CAM entry size.

If the same BCH error coding is applied to the (unencoded) incoming data path and to the (unencoded) data from the external CAM loading device (usually a processor), then the encoding process can be made invisible externally with the CAM system.

In the CAM with this data encoding, e=1, so H=2e+1=3, which implies that all input code words will be at least 3 bits different in the encoded domain. Therefore, at least three devices will be pulling the CAM match line low in the smallest difference case, resulting in almost three times faster match line discharging at this stage. With a 6.25% estimated increase in match line capacitance due to the code overhead, approximately a 3/1.0625=2.82 times overall increase in speed is realized. The match line discharge is one of the slowest stages in a CAM, limiting its clock rates and throughput, so such an increase in speed at the match line discharge stage results in an improvement in speed performance.

For a Hamming distance of two, using a simple parity check adds just one bit to a B-bit code word. In this case, at least two devices will discharge the match line, and for B=32, a small 3.2% capacitance and size increase is required, resulting in a still substantial 1.94 times increase in match line discharge speed.

Note that error correcting codes are used purely to obtain a guaranteed minimum Hamming Distance between all encoded words in the set. The codes are not used for error detection or correction in the CAM. The above method, thus, represents a novel use for error correcting code theory.

For TCAMs, the presence of X (always match) bit values in the TCAM entries makes it impossible to use the error correcting codes in the above described manner. This is because multiple input matches are possible for a given TCAM entry, whereas the error correcting codes encoded values are based on all the actual values of each bit (always a binary 0 or 1) of an input word to the TCAM. However, an alternative embodiment for guaranteeing multi-driver speed-ups is described, along with some minor restrictions on the way the TCAM is used.

The most common applications of TCAMs are in network address routing. In this application, each TCAM entry consists of two parts. The upper (most significant) part is the routing address prefix, and is represented as a simple binary pattern (with no X's). The remaining lower portion contains all X's. The boundary between the two regions can be set anywhere (except within the most significant eight bits). The number of X's in the lower region (e.g., M) therefore determines the size of a contiguous region of network addresses. The contiguous region of network addresses starts at the base address (obtained from the upper bits) and extends from all-zeros in the lower M bits to (but not including) the base address plus $2^M$. It is, therefore, quite reasonable to allow a block of TCAM entries to be grouped together at a lower level, such that at this level of TCAM address granularity, only TCAM match entries with the same prefix length can be placed within a block.

A simplest possible known example of a TCAM system using one extra bit of overhead in each word is now described. The example has very simple and fast encoding to achieve a minimum Hamming distance of 2. If a B-bit input word is XOR-WORed with a shifted-by-one value of itself, a new B+1 bit word is created. With the two-input "XOR-WOR" function, there is an open circuit and nothing is done (no change in the condition of the output line) if both inputs are the same. If the inputs are different then the output line is pulled low. The XOR-WOR function in CAMs is based on wire-or output logic of multiple bit compares so a precharge to high is used then an output line can only be pulled low or left alone in its previous high state. All wire-or drivers are tied together on a particular word comparison so even a single difference can pull the output line low. The present invention, however, uses multiple pulls low on word differences by using error correcting codes. For example, the 8-bit word (e.g., comparand):

```
1 0 1 1 1 0 1 1     8-bit comparand
1 0 1 1 1 0 1 1     obtained by shifting the above word right 1 bit
1 1 1 0 0 1 1 0 1   9-bit column-wise "XOR-WOR" result when 2 bits are
                    in column
```

This operation yields a code word of one extra bit compared to the uncoded word, which also increases the Hamming distance from one to two, because each bit appears in two adjacent columns above, and therefore changes the value of two output bits according to the column-wise "XOR-WOR" operator. In the case where only one bit appears in a column, its value passes to the output word.

This simple code requires only "XOR-WOR" gates on the incoming word path, and on the programming path to the CAM entries. It is fast and economical in hardware, and works correctly for CAMs. Note that this code is not systematic, i.e., it scrambles the original input value to obtain the new code, whereas adding a parity bit (equivalent in performance) is a systematic code, but requires more levels of "XOR-WOR" gates, so it is slower for wide words. Either systematic coding (e.g., parity) or non-systematic coding could be used. Non-systematic coding is preferred because non-systematic coding is faster. Systematic (e.g., parity) coding requires all the other bits of the word to calculate the parity bits, which is slower than non-systematic coding in which each output bit depends upon at most two input bits. As will be seen, the AND gate masking within a block, and before coding occurs (described below), makes the form of coding (systematic or non-systematic) used immaterial except for speed.

Another example in which the same 8 top bits are extended to a 10 bit code by padding the two least significant bits with 1's is as follows:

```
1 0 1 1 1 0 1 1 1 1
1 0 1 1 1 0 1 1 1 1        shift upper word right 1 bit to get lower word
1 1 1 0 0 1 1 0 0 0 1      11-bit column-wise "XOR-WOR" result when 2 bits
                           in column
                           note the difference from the first example result for
                           9 bits
```

Padding in the broadest sense is the addition of one or more bits to one or both ends of a binary word. For purposes of the present invention, padding is the addition of one or more bits to the right end (least significant end) of the CAM/TCAM storage locations and the comparand. For CAM words the added bits are 0's and for TCAM words the added bits are X's.

It can be seen that the top eight bits are the same as in the previous case, but the next bit has changed from a 1 to a 0, and the bottom two bits are newly added. If the code is to be useful with X's in matches, and if the 9-bit pattern in the first example is used as the matching word in the TCAM (to match its corresponding input pattern), then an 11-bit matching pattern like:

1 1 1 0 0 1 1 0 1 X X would be used. However, this results in a mismatch with the 11-bit result in the second extended example, with the mismatch occurring on the 3rd bit from the right. Otherwise, the matching criteria works correctly. The reason for the failure is that unknown values also propagate into two adjacent columns, so that the two bottom X values naturally imply 3 X's are required at the bottom of the match criteria. Unfortunately, this violates the first example, which requires nine bits of 0 or 1 values to obtain a Hamming Distance of two in the worst case.

The solution to this problem is to modify the method to find the most significant incoming data bit that contributes to the most significant X in the encoded match entry domain. This data bit also contributes to the value of the bit above it (due to the shift-by-one propagation), whose value is important. Forcing this incoming data bit to zero is accomplished by providing an "AND" gate at each bit before going into the "XOR-WOR" gates. The correct behavior is then achieved at that bit, and the lower bits can do anything as they are bound to match with the X's. Unfortunately, the bit position to apply the "AND" disable varies directly with the prefix length, and the "XOR-WOR" gates that come after. Therefore, each block of TCAM entries (with each entry dealing with B bits of unencoded incoming data) requires an overhead of B each of "AND" gates and "XOR-WOR" gates. This quantity is independent of the number of entries in a block, so larger blocks will have smaller overhead.

An important characteristic of the simple shift-XOR-WOR code is that its behavior is independent of the prefix length (apart from the "AND" gate masking correction). In general, if block-error correcting codes are used, a different code size has to be used for each prefix length allowable within each block of TCAM entries.

The "AND" gate masking for each block needs to be controlled. A 'programmable position value register' can be provided with a decoder or selector to control the disabling "AND" mask. Alternatively, an independently programmable 'bit enable store' register can be assigned to each bit within a block of entries for complete individual "AND" mask control. In the latter case, the "AND" gates with lower bit significance can then be used to force all the lower values to zero from the incoming data, further reducing unwanted activity within an entry block, and possibly reducing power consumption. Forcing lower bits to a known state also allows conventional CAM cells to be used instead of TCAM cells, which may help to reduce the overall design.

For support of 'X' matching in situations where error correcting codes are used with Hamming distances greater than 2, it is best to use a systematic coding scheme, which preserves the original code-word and adds the additional bits used to provide a Hamming distance. If 'X' bits are used in a TCAM block of entries, they are instead programmed to a known level (say '0'), and then encoded for Hamming distance. This use of a known level instead of 'X' allows a conventional CAM to be used instead of a TCAM. Then, on the input path, all bits to be compared with what were X bits are also forced to the known level (within that CAM block of entries only), and then encoded to give Hamming distance before comparison for CAM matching. Other blocks may have different 'X' bits, forcing other input bit patterns to the known level instead. This use of a CAM to replace a TCAM is only possible because of the overhead logic per block of entries, otherwise, this approach lacks the flexibility of each TCAM entry to be programmed with X's independently.

For an exact match (no X's), all "AND" mask bits are enabled, and the system behaves like a (faster) CAM.

For larger B (incoming word widths), match line capacitances can become too large for high speeds, so the match lines can be broken into sections and logically recombined to obtain an overall match result. Each separate match line segment is responsible for independently matching some number of bits in the incoming input, and for generating its own Hamming distance coding, so the increase in speed as a result of the coding can be applied independently to each segment.

This is accomplished as follows:

For a particular prefix length, a TCAM can be implemented as a CAM block by masking off both the "don't care" bits in both the comparand, and the CAM words stored in CAM memory. The "don't care" bits are forced to a known state (zero in the example below), so that the "don't care" bits will always match as required.

This type of ternary CAM can be given any size of Hamming distance by using an error correction code that increases the encoded word size to produce the required Hamming Distance. The larger words are generated by encoding the CAM words for storage in the CAM and by encoding the comparand (using the same type of encoding system).

To set up the CAM for a particular prefix length, the "don't care" bits are masked off on the comparand (to zero), the masked comparand is encoded using an error correcting code, and the encoded comparand is saved. The CAM is set to "run" mode. As each CAM word comes in for comparison, it is similarly masked to force its "don't care" bits to zero, and it is similarly encoded. Each encoded CAM word is compared against the comparand as with a regular CAM.

This scheme assumes that each CAM block has the same prefix length because only one error coder on the data input is used per block. A larger CAM system able to deal with multiple prefix lengths is created by using several of these CAM blocks, each with its own prefix masking and error correction coding. This means that: 1) For L different prefix lengths, L error correction coders are needed, and L associated CAM blocks. If the maximum number of words stored per block (B) is too small, then the error correction coder circuits are a significant overhead in each block. 2) This scheme is less flexible than a true TCAM where each word can be programmed to deal with any prefix length (i.e., the don't cares are programmable for each word).

However, for larger CAMs, if each CAM block can be programmed to deal with any prefix length (i.e., the masking is programmable), then a host processor can group the comparand words by prefix length so that they can be efficiently stored into a multi-block CAM system. For a CAM block size B, and for R words of a given prefix length L, then the number of blocks devoted to that prefix is given by:

$$\text{Blocks}(L) = \text{ceiling}(R/L)$$

For storage of W words total, with L different prefix lengths, and a CAM block size B, the worst-case total number of blocks needed does not exceed T where:

if $W < L$ then $T = W$ else $T = \text{floor}((W-L)/B) + L$

For example, if W=100,000 data words that need to be placed in the CAM system, and if each CAM block can hold B=1024 words, and if L=25 different prefix lengths, then W is greater than L, and so:

$$T = \text{floor}((100{,}000-25)/1024) + 25 = 122 \text{ blocks}$$

Using 122 blocks=124,928 words maximum, the worst-case efficiency is 100,000/124,928=0.800 or about 80% of total capacity in this case.

Some numerical examples follow:

The modified method is now shown with an 8-bit prefix in a 12-bit input data format, and represented as 13 bits internally. The comparison is shown using a CAM (no ternary values needed), so the "AND" gate masking function disables all incoming data that is not in the prefix. This makes "AND" masking slower or more complex, but the use of a CAM instead of a TCAM creates savings elsewhere. The masking of the prefix for the incoming CAM is words not shown. It should be appreciated that shifting the CAM word right one bit is equivalent to shifting the CAM word left and reversing their positions with respect to each other. Similarly, with respect to a comparand. Therefore, while the examples are given with using a right shift, they could be given equivalently with respect to a left shift.

Obtain the match pattern for 1 0 1 1 1 0 1 0

| | |
|---|---|
| 1 0 1 1 1 0 1 1 | (1) 8-bit incoming CAM word |
| 1 0 1 1 1 0 1 1 | (2) obtained by shifting above word right 1 bit |
| 1 1 1 0 0 1 1 0 1 0 0 0 0 | (3) 13-bit encoded CAM word: column-wise XOR-WOR of (1) and (2), 0-padded |

The value (3) forms an encoded CAM word to be stored in a 13-bit CAM storage location.

EXAMPLE 1

Comparand Match

The 12-bit comparand for a 13-bit match example is processed as follows. Any padding is included and not specifically pointed out.

| | |
|---|---|
| 1 0 1 1 1 0 1 1 1 1 0 0 | (4) 12 bit comparand, top 8 prefix matches (1) |
| 1 1 1 1 1 1 1 1 0 0 0 0 | (5) "AND" mask for 8-bit prefix (top 8 bits enabled) |
| 1 0 1 1 1 0 1 1 0 0 0 0 | (6) column-wise "AND" of (4) and (5) |
| 1 0 1 1 1 0 1 1 0 0 0 0 | (7) is (6) shifted right by 1 bit |
| 1 1 1 0 0 1 1 0 1 0 0 0 0 | (8) column-wise "XOR-WOR" of (6) and (7) |
| 1 1 1 0 0 1 1 0 1 0 0 0 0 | (3) 13-bit match word in CAM storage location |

The result (8) matches the encoded CAM word (3).

EXAMPLE 2

Comparand Mismatches by One Bit

The following 12-bit comparand is one bit different (5th bit from left) from the incoming data (4) which is shown to match (1) above. As this bit change occurs within the 8-bit prefix, a mismatch with the entry (3) is expected. Any padding is included and not specifically pointed out.

| | |
|---|---|
| 1 0 1 1 0 0 1 1 1 1 0 0 | (9) 12 bit comparand |
| 1 1 1 1 1 1 1 1 0 0 0 0 | (10) "AND" mask for 8-bit prefix (top 8 bits enabled) |
| 1 0 1 1 0 0 1 1 0 0 0 0 | (11) column-wise "AND" of (9) and (10) |
| 1 0 1 1 0 0 1 1 0 0 0 0 | (12) is (11) shifted right by 1 bit |
| 1 1 1 0 1 0 1 0 1 0 0 0 0 | (13) column-wise "XOR-WOR" of (11) and (12) |
| 1 1 1 0 0 1 1 0 1 0 0 0 0 | (3) 13-bit encoded CAM word stored in a CAM storage location |
| 0 0 0 0 1 1 0 0 0 0 0 0 0 | (14) mismatched bits between (13) and (3) |

The result (13) mismatches the encoded CAM word (3) by 2 bits as expected.

The modified method is now shown with an 8-bit prefix in a 12-bit TCAM entry format, and represented as 13 bits internally. The comparison is shown using a TCAM, which simplifies the "AND" masking generation function to a 1-of-B selector, but requires a TCAM for the lower (non-prefix) bits. The masking of the prefix is not shown.

Obtain the match pattern for 1 0 1 1 1 0 1 0

| | |
|---|---|
| 1 0 1 1 1 0 1 1 | (1) 8-bit incoming TCAM word |
| 1 0 1 1 1 0 1 1 | (2) obtained by shifting above word right 1 bit |
| 1 1 1 0 0 1 1 0 1 X X X X | (3) 13-bit encoded TCAM word: column-wise "XOR-WOR" of (1) and (2), X padded |

The value (3) forms an encoded TCAM word to be stored in a 13-bit TCAM storage location.

EXAMPLE 1

Comparand Match

The 12-bit comparand for a 13-bit match example is processed as follows:

| | |
|---|---|
| 1 0 1 1 1 0 1 1 1 1 0 0 | (4) 12 bit comparand, top 8 prefix matches (1) |
| 1 1 1 1 1 1 1 1 0 1 1 1 | (5) single bit "AND" mask for 8 bit prefix |
| 1 0 1 1 1 0 1 1 0 1 0 0 | (6) column-wise "AND" of (4) and (5) |
| 1 0 1 1 1 0 1 1 0 1 0 0 | (7) is (6) shifted right by 1 bit |
| 1 1 1 0 0 1 1 0 1 1 1 0 0 | (8) column-wise "XOR-WOR" of (6) and (7) |
| 1 1 1 0 0 1 1 0 1 X X X X | (3) 13-bit encoded TCAM word (padded) |

The result (8) matches the encoded TCAM word (3).

EXAMPLE 2

Comparand Mismatch by One Bit

The following 12-bit comparand is one bit different (5th bit from left) to the incoming data (4) which is shown to match (1) above. As this bit change occurs within the 8-bit prefix, a mismatch with the entry (3) is expected.

| | |
|---|---|
| 1 0 1 1 0 0 1 1 1 1 0 0 | (9) 12 bit comparand 1 bit different to (4) |
| 1 1 1 1 1 1 1 1 0 1 1 1 | (10) single bit "AND" mask for 8-bit prefix |
| 1 0 1 1 0 0 1 1 0 1 0 0 | (11) column-wise "AND" of (9) and (10) |
| 1 0 1 1 0 0 1 1 0 1 0 0 | (12) is (11) shifted right by 1 bit |
| 1 1 1 0 1 0 1 0 1 1 1 0 0 | (13) column-wise "XOR-WOR" of (11) and (12) |
| 1 1 1 0 0 1 1 0 1 X X X X | (3) 13-bit encoded TCAM word (padded) |
| 0 0 0 0 1 1 0 0 0 0 0 0 0 | (14) mismatched bits between (13) and (3) |

The result (13) mismatches the encoded TCAM word (3) by 2 bits as expected.

FIG. 1A is an n-bit TCAM parity coding circuit 100 of an embodiment of the present invention. It should be appreciated that either systematic (parity) coding or non-systematic coding could be used. This circuit is needed for each block of TCAM words. The match pattern is loaded via the TCAM load control bus 105 for each incoming TCAM word within the block. Parity coding maps the n-bit TCAM program bus input 110 to n+1 bits to store in the TCAM match cells via test/load bus 120. For example, for a 32-bit TCAM entry with the least significant 8-bits "don't care" load into storage:

11111111 11111111 11111111 00000000

Figure 1B:
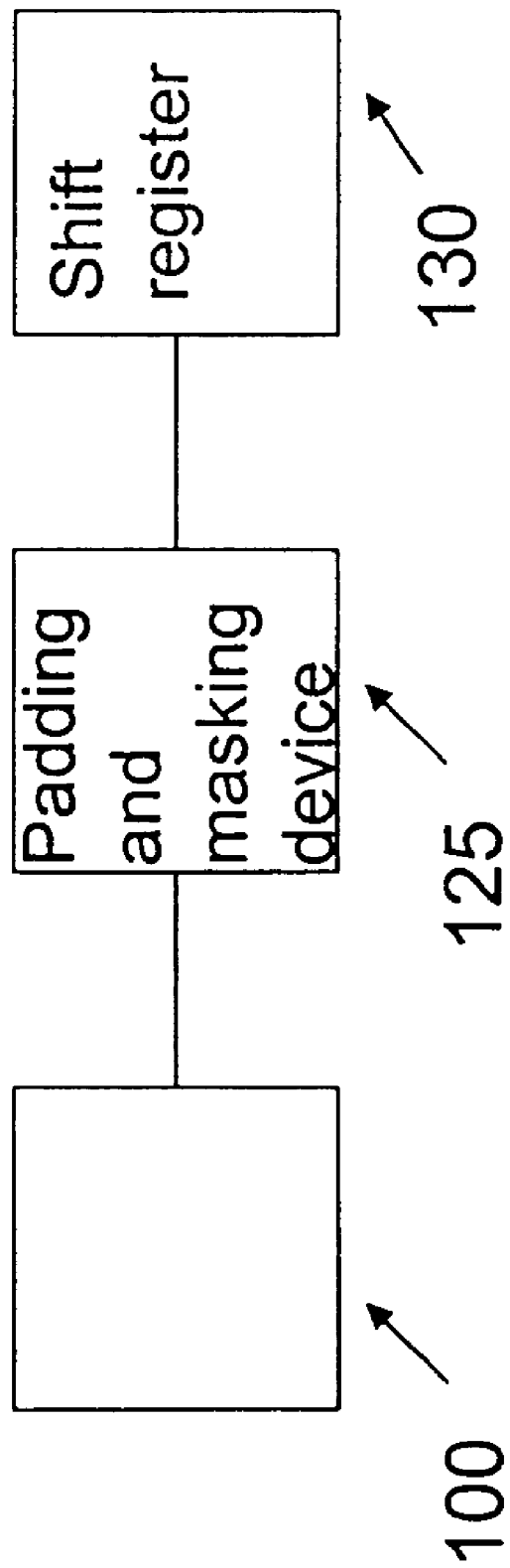
FIG. 1B is a block diagram of the parity encoding circuit of FIG. 1A and a padding and masking device and shift register.

The simple parity coding (Hamming distance of 2) takes place in TCAM coding circuits 115. FIG. 1B is a block diagram of the parity encoding circuit of FIG. 1A 100, a padding and masking device 125 and a shift register 130. One or more separate devices are used to perform padding (by 0 or 1), and masking. Shifting may be performed in the shift register 130.

FIG. 1C is an exemplary embodiment of a TCAM of the invention in functional block form. TCAM 101 includes memory storage locations 135a . . . 135n. TCAM memory storage location 135n and comparand register 140 are coupled to match detector circuit 145. Each TCAM memory storage location is similarly coupled to a match detector circuit and a copy of comparand register 140. Match detector circuit 145 performs comparisons between each bit of comparand register 140 and each bit of TCAM memory storage location 135n. These comparisons are performed concurrently over all memory storage locations 135a . . . 135n and all copies of comparand register 140. The comparand register 140 is loaded with the input data word (i.e., the comparand) to be compared. The bit on the right end of comparand register 140 and each TCAM memory storage location 135a . . . 135n is one bit of extra parity. The right pointing arrow above or below each TCAM memory storage location 135a . . . 135n and comparand register 140 indicates the shift direction for the encoding process of the invention.

FIG. 2 is one of the TCAM parity coding circuits 115 of FIG. 1A. A bit of the TCAM entry is input via TCAM load control bus 105 and stored in bit enable store 205. TCAM look-up/program bus input 110 passes through the TCAM parity coding circuit via "AND" gate 210 to be parity encoded via "XOR-WOR" gate 215 onto test/load bus 120. TCAM matching and priority encoding is then performed similarly to a conventional TCAM but using an extra parity bit for each entry.

FIG. 3 is a flowchart of a method of the invention used for TCAM devices. The hamming distance for TCAM devices is fixed at two. For each TCAM entry, the entry is loaded at step 310 followed by "AND" masking of the prefix of the entry at step 315. A columnwise "AND" is performed at step 320 followed by shifting the entry right one bit and padding as necessary for Hamming distance at step 325. A columnwise "XOR-WOR" is performed on each 0 padded TCAM entry at step 330. Steps 335–355 are identical to steps 310–330 but are performed on the comparand. Finally, at step 360 the CAM entries are tested against the comparand, with the result that more mismatches means that the match line discharges faster at step 370.

Figure 4A:
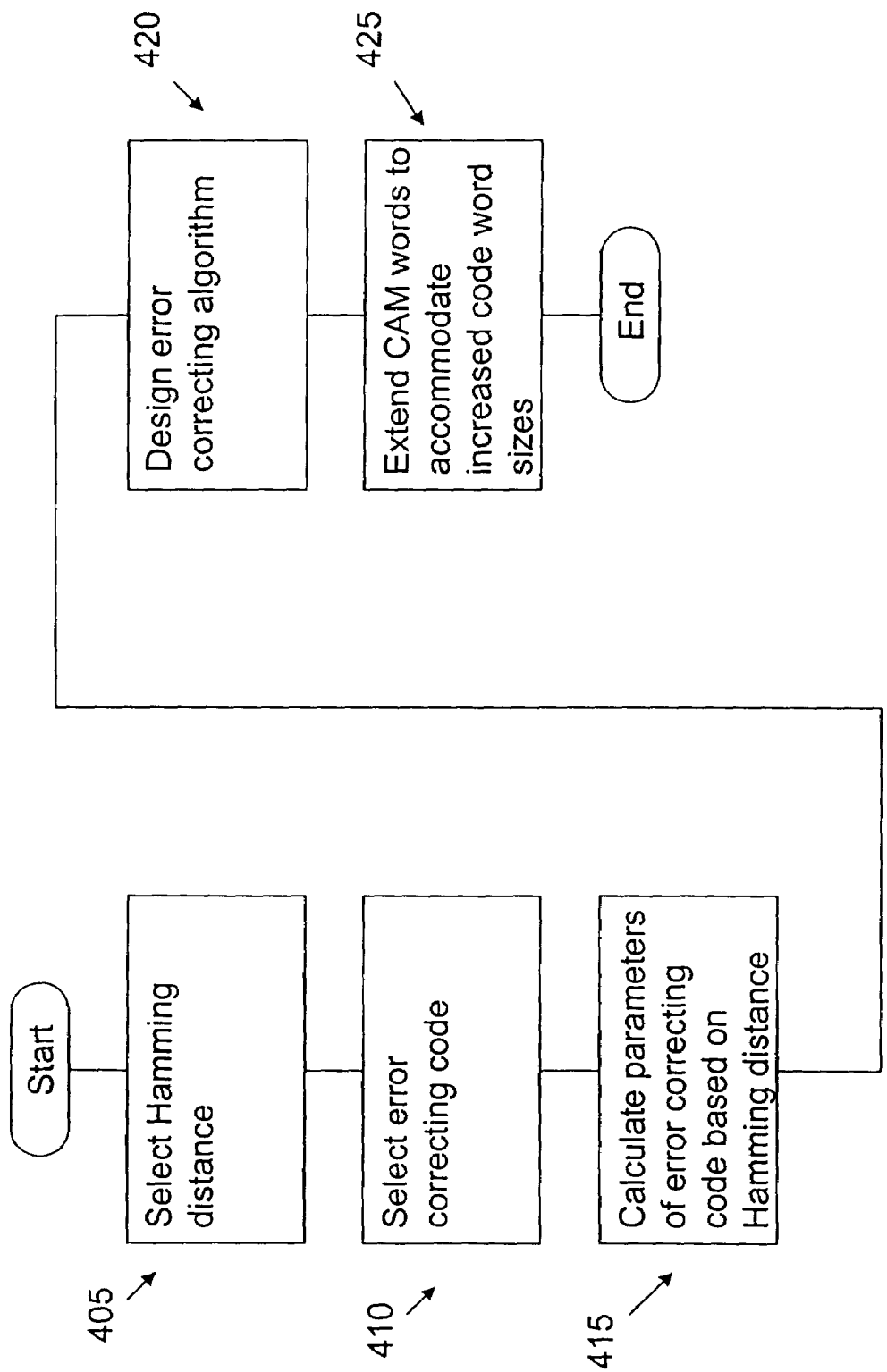
FIG. 4A is a flowchart of one method of designing an error correcting system of the invention used for CAM devices.

FIG. 4A is a flowchart of one method of designing an error correcting system used for CAM devices in accordance with an exemplary embodiment of the invention. The illustrated method does not apply to TCAMs. Based on the requirements for CAM performance, at step 405 a selection is made of a desired Hamming distance (to determine the number of bits to use for padding). An error correcting code is selected at step 410. The Hamming distance is then used to calculate the parameters of the code at step 415, and an error correcting algorithm is designed for the CAM system at step 420. The CAM words are extended to accommodate the increased code word sizes at step 425.

Figure 4B:
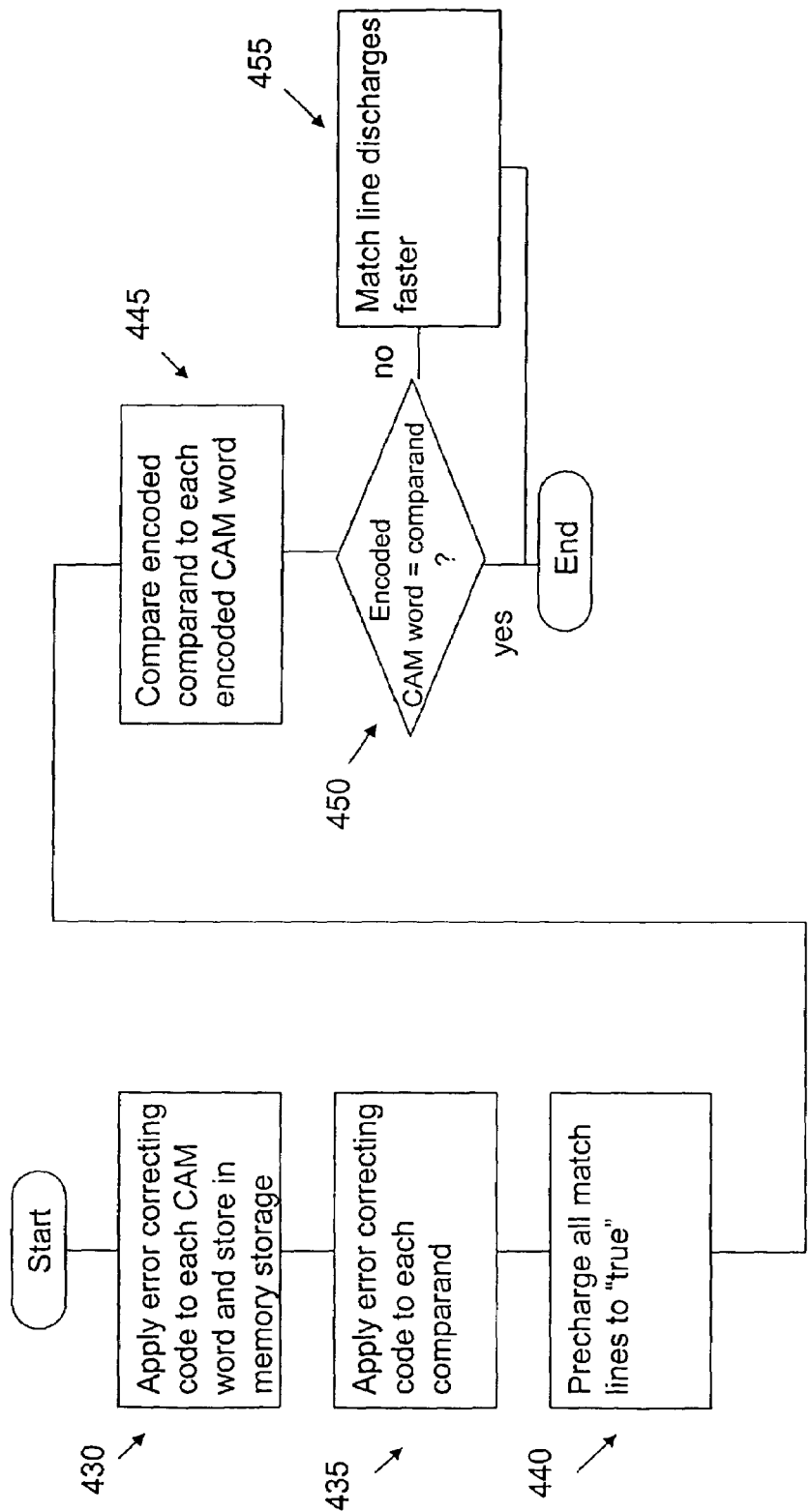
FIG. 4B is a flowchart of one method of the invention used for CAM devices.

FIG. 4B is a flowchart of one method of the invention used for CAM devices. According to the illustrated method:

1) Each word to be matched is error correction coded, and loaded into the CAM at its own memory location, along with any other ancillary data associated with the word. Error correction coding is accomplished at step 430 by:
   a) masking the prefix of the CAM word
   b) columnwise ANDing CAM word with masked word
   c) shifting result right one bit and padding as necessary
   d) columnwise XOR-WORing the shifted CAM word and masked CAM word
2) After all words are encoded and loaded into the CAM, the CAM is ready for accepting incoming data words (comparands) and comparing them with the CAM entries.

The following acts apply to each incoming data word:

3) Each incoming data word is error correction coded at step 435, using the same algorithm (and possibly the same actual encoder as in step (1)).
4) All the match lines for each CAM entry are precharged to a 'true' match state at step 440.
5) The coded incoming data word is compared with every valid coded word loaded in (1) at step 445 and tested at step 450. If a code differs, it differs by several bits due to the error correction coding, so the corresponding match line will be rapidly pulled to 'false' i.e., discharged at step 455. If the code matches, then the precharged state set in (4) remains. The match line is sampled at a safe time when it is known that the worst-case match time will have allowed a slowest mismatch to occur.
6) If one or more coded words match, then a "CAM match" occurs, and the associated data of the word that has the highest match priority (based on a pre-arranged scheme) is returned, or the address of the matching word is returned. If no coded words match, then a "CAM mismatch" occurs.

Figure 5:
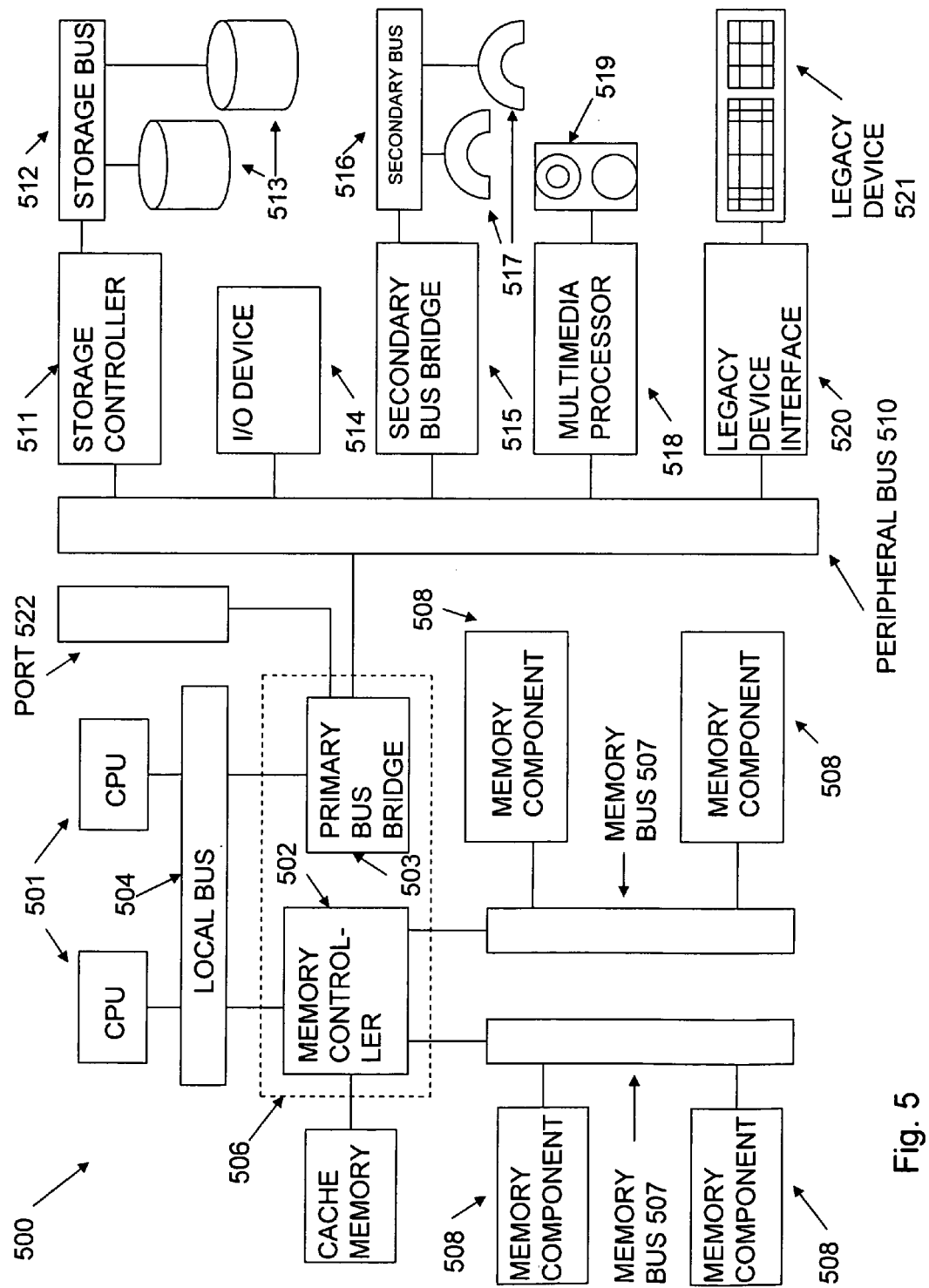
FIG. 5 is a block diagram of a processing system using an embodiment of the invention.

FIG. 5 illustrates an exemplary processing system 500 which may utilize a processor coupled to a CAM or TCAM having an encoder constructed in accordance with any of the embodiments of the present invention disclosed above in connection with FIGS. 1–4. The processing system 500 includes one or more processors 501 coupled to a local bus 504. A memory controller 502 and a primary bus bridge 503 are also coupled to the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508 which include at least one CAM or TCAM device having an encoder of the present invention. The memory components 508 may be a memory card or a memory module. Examples of memory modules include single inline memory modules (SIMMs) and dual inline memory modules (DIMMs). The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 includes peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, an miscellaneous I/O device 514, a secondary bus bridge 515, a multimedia processor 518, and an legacy device interface 520. The primary bus bridge 503 may also coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be an local area network interface, such as an Ethernet card. The secondary bus bridge may be used to interface additional devices via another bus to the processing system. For example, the secondary bus bridge 516 may be an universal serial port (USB) controller used to couple USB bus devices 517 via to the processing system 500. The multimedia processor 518 may be a sound card, a video capture card, or any other type of media interface, which may also be coupled to one additional devices such as speakers 519. The legacy device interface 520 is used to couple legacy devices, for example, older styled keyboards and mice, to the processing system 500.

The processing system 500 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 500 to become more suitable for use in a variety of applications such as a network router, a database search engine or other applications. In addition, for use in a router, a simpler processor architecture may be used to couple the CAM or TCAM memory devices to a processor.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. An apparatus for operating a content addressable memory (CAM) device comprising:
   an encoding circuit for encoding an incoming CAM word to produce an encoded CAM word such that a one-bit mismatch between a comparand and said incoming CAM word results in at least a M-bit mismatch between said encoded CAM word and a similarly encoded comparand;
   a circuit for precharging a match line to a predetermined state before a comparison between said encoded CAM word and said similarly encoded comparand; and
   a memory storage location for storing said encoded CAM word.

2. The apparatus according to claim 1, wherein said encoding circuit further comprises:
   a masking device for masking a prefix of said loaded CAM word;
   a shift register for shifting said masked CAM word; and
   an exclusive-OR wire-OR (XOR-WOR) gate for performing an XOR-WOR operation between said masked CAM word and said shifted CAM word.

3. The apparatus according to claim 2, wherein said masking device further comprises a test/load bus for storing a result of said XOR-WOR operation in said memory storage location.

4. The apparatus according to claim 2, wherein said masking device further comprises:
   a bit enable store assigned to a bit of said prefix of said loaded CAM word for controlling said masking of said CAM word; and
   an AND gate for masking said bit of said prefix of said CAM word in accordance with said bit enable store.

5. The apparatus according to claim 2, wherein said shift register shifts said masked CAM word right one bit.

6. The apparatus according to claim 2, wherein said masking device further comprises:
   a program position value register for decoding and selecting which bits of said prefix of said loaded CAM word are masked; and
   an AND gate for masking said bits of said prefix of said CAM word in accordance with said program position value register.

7. The apparatus according to claim 2, wherein said shifted CAM word is padded with zeros.

8. The apparatus according to claim 2, wherein said encoding circuit further comprises:
   a masking device for masking a prefix of said comparand;
   a shift register for shifting said masked comparand; and
   an exclusive-OR wire-OR (XOR-WOR) gate for performing an XOR-WOR operation between said masked comparand and said shifted comparand, said encoded comparand being compared to said encoded CAM word.

9. The apparatus according to claim 8, wherein said masking device further comprises:
   a bit enable store assigned to a bit of said prefix of said comparand for controlling said masking of said comparand; and
   an AND gate for masking said bit of said prefix of said comparand in accordance with said bit enable store.

10. The apparatus according to claim 8, wherein said shift register shifts said masked CAM word right one bit.

11. The apparatus according to claim 8, wherein said masking device further comprises:
    a program position value register for decoding and selecting which bits of said prefix of said comparand are masked; and
    an AND gate for masking said bits of said prefix of said comparand in accordance with said program position value register.

12. The apparatus according to claim 1, wherein said encoding circuit implements an error correcting code.

13. The apparatus according to claim 12, wherein said error correcting code has a Hamming distance greater than one.

14. An apparatus for operating a ternary content addressable memory (TCAM) device comprising:
    a masking device for producing a masked TCAM word by masking off all bits in an incoming TCAM word that are not used in a matching prefix;
    an encoding circuit for encoding said masked TCAM word to produce an encoded TCAM word such that a one-bit mismatch between a comparand and said incoming TCAM word results in at least a M-bit mismatch between said encoded TCAM word and a similarly encoded comparand;
    a circuit for precharging a match line to a predetermined state before a comparison between said encoded TCAM word and said similarly encoded comparand; and
    a memory storage location for storing said encoded TCAM word.

15. The apparatus according to claim 14, wherein said TCAM device comprises a plurality of hierarchical of blocks.

16. The apparatus according to claim 15, wherein each word of each block of said TCAM device has a same prefix length.

17. The apparatus according to claim 14, wherein said shifted TCAM word is padded with don't care values.

18. The apparatus according to claim 14, wherein said encoding circuit further comprises:
    a shift register for shifting said masked TCAM word; and
    an exclusive-OR wire-OR (XOR-WOR) gate for performing an XOR-WOR operation between said masked TCAM word and said shifted TCAM word.

19. The apparatus according to claim 18, wherein said masking device further comprises a test/load bus for storing a result of said XOR-WOR operation in said memory storage location.

20. The apparatus according to claim 18, wherein said masking device further comprises:
a bit enable store assigned to a bit of said prefix of said loaded TCAM word for controlling said masking of said TCAM word; and
an AND gate for masking said bit of said prefix of said TCAM word in accordance with said bit enable store.

21. The apparatus according to claim 18, wherein said shift register shifts said masked TCAM word right one bit.

22. The apparatus according to claim 18, wherein said masking device further comprises:
a program position value register for decoding and selecting which bits of said prefix of said loaded TCAM word are masked; and
an AND gate for masking said bits of said prefix of said TCAM word in accordance with said program position value register.

23. The apparatus according to claim 18, wherein said encoding circuit further comprises:
a masking device for masking a prefix of said comparand;
a shift register for shifting said masked comparand; and
an exclusive-OR wire-OR (XOR-WOR) gate for performing an XOR-WOR operation between said masked comparand and said shifted comparand, said encoded comparand being compared to said encoded TCAM word.

24. The apparatus according to claim 23, wherein said masking device further comprises:
a bit enable store assigned to a bit of said prefix of said comparand for controlling said masking of said comparand; and
an AND gate for masking said bit of said prefix of said comparand in accordance with said bit enable store.

25. The apparatus according to claim 23, wherein said shift register shifts said masked TCAM word right one bit.

26. The apparatus according to claim 23, wherein said masking device further comprises:
a program position value register for decoding and selecting which bits of said prefix of said comparand are masked; and
an AND gate for masking said bits of said prefix of said comparand in accordance with said program position value register.

27. The apparatus according to claim 14, wherein said encoding circuit implements an error correcting code.

28. The apparatus according to claim 27, wherein said error correcting code has a Hamming distance of two.

29. A processing system comprising:
a processor;
a content addressable memory (CAM) device coupled to said processor via a bus, said CAM device comprising an apparatus for operating said CAM device, said apparatus comprising:
an encoding circuit for encoding an incoming CAM word to produce an encoded CAM word and having the property that a one-bit mismatch between a comparand and said incoming CAM word will produce at least a two-bit mismatch between said encoded CAM word and a similarly encoded comparand;
a circuit for precharging a match line to a predetermined state before a comparison between said encoded CAM word and said similarly encode comparand; and
a memory storage location for storing said encoded CAM word.

30. A processing system comprising:
a processor;
a ternary content addressable memory (TCAM) device coupled to said processor via a bus, said TCAM device comprising an apparatus for operating said TCAM device, said apparatus comprising:
a masking circuit for producing a masked TCAM word by masking off all bits in an incoming TCAM word that are not used in a matching prefix;
an encoding circuit for encoding said masked TCAM word to produce an encoded TCAM word such that a one-bit mismatch between a comparand and said incoming TCAM word results in at least a two-bit mismatch between said encoded TCAM word and a similarly encoded comparand;
a circuit for precharging a match line to a predetermined state before a comparison between said encoded TCAM word and said similarly encode comparand; and
a memory storage location for storing said encoded TCAM word.

31. A method for operating a content addressable memory (CAM) device comprising:
encoding an incoming CAM word to produce an encoded CAM word such that a one-bit mismatch between a comparand and said incoming CAM word results in at least an M-bit mismatch between said encoded CAM word and a similarly encoded comparand;
precharging a match line to a predetermined state before a comparison between said encoded CAM word and said encoded comparand; and
storing said encoded CAM in a memory storage location of said CAM device.

32. The method according to claim 31, further comprising:
masking a prefix of said loaded CAM word;
shifting said masked CAM word; and
performing an exclusive-OR wire-OR (XOR-WOR) operation between said masked CAM word and said shifted CAM word.

33. The method according to claim 32, further comprising:
controlling said masking of said prefix of said CAM word using a bit assigned for that purpose; and
performing an AND operation to mask said prefix of said CAM word in accordance with said controlling bit.

34. The method according to claim 32, wherein said shifting said masked CAM word right one bit.

35. The method according to claim 32, wherein said masking further comprises:
decoding and selecting which bits of said prefix of said loaded CAM word are masked; and
performing an AND operation in order to mask said bits of said prefix of said CAM word in accordance with said decoding and selecting.

36. The method according to claim 32, wherein said shifted CAM word is padded with zeros.

37. The method according to claim 32, further comprising:
masking a prefix of said comparand;
shifting said masked comparand;

performing an XOR-WOR operation between said masked comparand and said shifted comparand; and comparing said encoded comparand to said encoded CAM word.

38. The method according to claim 37, wherein said masking device further comprises:

controlling said masking of said prefix of said comparand using a bit assigned for that purpose; and performing an AND operation to mask said prefix of said comparand in accordance with said controlling bit.

39. The method according to claim 37, wherein said shifting said masked CAM word right one bit.

40. The method according to claim 37, wherein said masking further comprises:

decoding and selecting which bits of said prefix of said comparand are masked; and performing an AND operation in order to mask said bits of said prefix of said comparand in accordance with said decoding and selecting.

41. The method according to claim 32, wherein said encoding is performed using an error correcting code.

42. The method according to claim 41, wherein said error correcting code has a Hamming distance greater than one.

43. A method for operating a ternary content addressable memory (TCAM) device comprising:

masking off all bits in an incoming TCAM word that are not used in a matching prefix to produce a masked TCAM word;

encoding said masked TCAM word to produce an encoded TCAM word such that a one-bit mismatch between a comparand and said incoming TCAM word results in at least a two-bit mismatch between said encoded TCAM word and a similarly encoded comparand;

precharging a match line to a predetermined state before a comparison between said encoded TCAM word and said encoded comparand; and storing said encoded TCAM in a memory storage location of said TCAM device.

44. The method according to claim 43, wherein said TCAM device comprises a plurality of hierarchal blocks.

45. The method according to claim 44, wherein each word of each block of said TCAM device has a same prefix length.

46. The method according to claim 43, wherein said shifted TCAM word is padded with don't care values.

47. The method according to claim 43, further comprising:

shifting said masked TCAM word; and performing an exclusive-OR wire-OR (XOR-WOR) operation between said masked TCAM word and said shifted TCAM word.

48. The method according to claim 47, further comprising:

controlling said masking of said prefix of said TCAM word using a bit assigned for that purpose; and performing an AND operation to mask said prefix of said TCAM word in accordance with said controlling bit.

49. The method according to claim 47, wherein said shifting said masked TCAM word right one bit.

50. The method according to claim 47, wherein said masking further comprises:

decoding and selecting which bits of said prefix of said loaded TCAM word are masked; and performing an AND operation in order to mask said bits of said prefix of said TCAM word in accordance with said decoding and selecting.

51. The method according to claim 43, further comprising:

masking a prefix of said comparand;

shifting said masked comparand;

performing an XOR-WOR operation between said masked comparand and said shifted comparand; and comparing said encoded comparand to said encoded TCAM word.

52. The method according to claim 51, wherein said masking further comprises:

controlling said masking of said prefix of said comparand using a bit assigned for that purpose; and performing an AND operation to mask said prefix of said comparand in accordance with said controlling bit.

53. The method according to claim 47, wherein said shifting said masked TCAM word right one bit.

54. The method according to claim 47, wherein said masking further comprises:

decoding and selecting which bits of said prefix of said comparand are masked; and performing an AND operation in order to mask said bits of said prefix of said comparand in accordance with said decoding and selecting.

55. The method according to claim 43, wherein said encoding is performed using an error correcting code.

56. The method according to claim 55, wherein said error correcting code has a Hamming distance of two.

* * * * *

UNITED STATES PATENT AND TRADEMARK OFFICE
CERTIFICATE OF CORRECTION

| | |
|---|---|
| PATENT NO. | : 7,243,290 B2 |
| APPLICATION NO. | : 10/616958 |
| DATED | : July 10, 2007 |
| INVENTOR(S) | : Keith R. Slavin |

It is certified that error appears in the above-identified patent and that said Letters Patent is hereby corrected as shown below:

In the Specification, the following errors are corrected:

Column 1, line 62, "it" should read --its--;

Column 5, line 36, "used then" should read --used, then--;

Column 5, lines 45-49:

"1 0 1 1 1 0 1 1    8-bit comparand 1 0 1 1 1 0 1 1    obtained by shifting the above word right 1 bit 1 1 1 0 0 1 1 0 1  9-bit column-wise "XOR-WOR" result when 2 bits are in column"

Should read

--1 0 1 1 1 0 1 1    8-bit comparand 1 0 1 1 1 0 1 1    obtained by shifting the above word right 1 bit 1 1 1 0 0 1 1 0 1    9-bit column-wise "XOR-WOR" result when 2 bits are in column--;

Column 6, lines 15-20:

"1 0 1 1 1 0 1 1 1 1

1 0 1 1 1 0 1 1 1 1    shift upper word right 1 bit to get lower word 1 1 1 0 0 1 1 0 0 0 1    11-bit column-wise "XOR-WOR" result when 2 bits in column"

Should read

--1 0 1 1 1 0 1 1 1 1

1 0 1 1 1 0 1 1 1 1    shift upper word right 1 bit to get lower word 1 1 1 0 0 1 1 0 0 0 1    11-bit column-wise "XOR-WOR" result when 2 bits in column--;

UNITED STATES PATENT AND TRADEMARK OFFICE
CERTIFICATE OF CORRECTION

PATENT NO. : 7,243,290 B2
APPLICATION NO. : 10/616958
DATED : July 10, 2007
INVENTOR(S) : Keith R. Slavin It is certified that error appears in the above-identified patent and that said Letters Patent is hereby corrected as shown below:

Column 8, lines 62-66:

"1 0 1 1 1 0 1 1        (1) 8-bit incoming CAM word 1 0 1 1 1 0 1 1       (2) obtained by shifting above word right 1 bit 1 1 1 0 0 1 1 0 1 0 0 0 0   (3) 13-bit encoded CAM word: column-wise XOR-WOR of (1) and (2), 0-padded"

Should read

--1 0 1 1 1 0 1 1        (1) 8-bit incoming CAM word 1 0 1 1 1 0 1 1       (2) obtained by shifting above word right 1 bit 1 1 1 0 0 1 1 0 1 0 0 0 0   (3) 13-bit encoded CAM word: column-wise XOR-WOR of (1) and (2), 0-padded--;

Column 9, lines 14-21:

"1 0 1 1 1 0 1 1 1 1 0 0    (4) 12 bit comparand, top 8 prefix matches (1)

1 1 1 1 1 1 1 1 0 0 0 0    (5) "AND" mask for 8-bit prefix (top 8 bits enabled)

1 0 1 1 1 0 1 1 0 0 0 0    (6) column-wise "AND" of (4) and (5)

1 0 1 1 1 0 1 1 0 0 0 0   (7) is (6) shifted right by 1 bit 1 1 1 0 0 1 1 0 1 0 0 0 0   (8) column-wise "XOR-WOR" of (6) and (7)

1 1 1 0 0 1 1 0 1 0 0 0 0   (3) 13-bit match word in CAM storage location"

UNITED STATES PATENT AND TRADEMARK OFFICE
CERTIFICATE OF CORRECTION

PATENT NO. : 7,243,290 B2
APPLICATION NO. : 10/616958
DATED : July 10, 2007
INVENTOR(S) : Keith R. Slavin It is certified that error appears in the above-identified patent and that said Letters Patent is hereby corrected as shown below:

Column 9, lines 14-21 (cont'd):

Should read

--1 0 1 1 1 0 1 1 1 1 0 0    (4) 12 bit comparand, top 8 prefix matches (1)

1 1 1 1 1 1 1 1 0 0 0 0    (5) "AND" mask for 8-bit prefix (top 8 bits enabled)

1 0 1 1 1 0 1 1 0 0 0 0    (6) column-wise "AND" of (4) and (5)

1 0 1 1 1 0 1 1 0 0 0 0    (7) is (6) shifted right by 1 bit 1 1 1 0 0 1 1 0 1 0 0 0 0    (8) column-wise "XOR-WOR" of (6) and (7)

1 1 1 0 0 1 1 0 1 0 0 0 0    (3) 13-bit match word in CAM storage location--;

Column 9, lines 37-45:

"1 0 1 1 0 0 1 1 1 1 0 0    (9) 12 bit comparand 1 1 1 1 1 1 1 1 0 0 0 0    (10) "AND" mask for 8-bit prefix (top 8 bits enabled)

1 0 1 1 0 0 1 1 0 0 0 0    (11) column-wise "AND" of (9) and (10)

1 0 1 1 0 0 1 1 0 0 0 0    (12) is (11) shifted right by 1 bit 1 1 1 0 1 0 1 0 1 0 0 0 0    (13) column-wise "XOR-WOR" of (11) and (12)

1 1 1 0 0 1 1 0 1 0 0 0 0    (3) 13-bit encoded CAM word stored in a CAM storage location 0 0 0 0 1 1 0 0 0 0 0 0    (14) mismatched bits between (13) and (3)"

Should read

--1 0 1 1 0 0 1 1 1 1 0 0    (9) 12 bit comparand 1 1 1 1 1 1 1 1 0 0 0 0    (10) "AND" mask for 8-bit prefix (top 8 bits enabled)

1 0 1 1 0 0 1 1 0 0 0 0    (11) column-wise "AND" of (9) and (10)

UNITED STATES PATENT AND TRADEMARK OFFICE
CERTIFICATE OF CORRECTION

PATENT NO. : 7,243,290 B2  
APPLICATION NO. : 10/616958  
DATED : July 10, 2007  
INVENTOR(S) : Keith R. Slavin Page 4 of 7

It is certified that error appears in the above-identified patent and that said Letters Patent is hereby corrected as shown below:

Column 9, lines 37-45 (cont'd):

| | |
|---|---|
| 1 0 1 1 0 0 1 1 0 0 0 0 | (12) is (11) shifted right by 1 bit |
| 1 1 1 0 1 0 1 0 1 0 0 0 0 | (13) column-wise "XOR-WOR" of (11) and (12) |
| 1 1 1 0 0 1 1 0 1 0 0 0 0 | (3) 13-bit encoded CAM word stored in a CAM storage location |
| 0 0 0 0 1 1 0 0 0 0 0 0 0 | (14) mismatched bits between (13) and (3)--; |

Column 9, lines 59-64:

| | |
|---|---|
| "1 0 1 1 1 0 1 1 | (1) 8-bit Incoming TCAM word |
| 1 0 1 1 1 0 1 1 | (2) obtained by shifting above word right 1 bit |
| 1 1 1 0 0 1 1 0 1 X X X X | (3) 13-bit encoded TCAM word: column-wise "XOR-WOR" of (1) and (2), X padded" |

Should read

| | |
|---|---|
| --1 0 1 1 1 0 1 1 | (1) 8-bit incoming TCAM word |
| 1 0 1 1 1 0 1 1 | (2) obtained by shifting above word right 1 bit |
| 1 1 1 0 0 1 1 0 1 X X X X | (3) 13-bit encoded TCAM word: column-wise "XOR-WOR" of (1) and (2), X padded--; |

Column 10, lines 8-15:

| | |
|---|---|
| "1 0 1 1 1 0 1 1 1 1 0 0 | (4) 12 bit comparand, top 8 prefix matches (1) |
| 1 1 1 1 1 1 1 1 0 1 1 1 | (5) single bit "AND" mask for 8 bit prefix |
| 1 0 1 1 1 0 1 1 0 1 0 0 | (6) column-wise "AND" of (4) and (5) |
| 1 0 1 1 1 0 1 1 0 1 0 0 | (7) is (6) shifted right by 1 bit |
| 1 1 1 0 0 1 1 0 1 1 1 0 0 | (8) column-wise "XOR-WOR" of (6) and (7) |

UNITED STATES PATENT AND TRADEMARK OFFICE
CERTIFICATE OF CORRECTION

PATENT NO.       : 7,243,290 B2                                    Page 5 of 7
APPLICATION NO.  : 10/616958
DATED            : July 10, 2007
INVENTOR(S)      : Keith R. Slavin It is certified that error appears in the above-identified patent and that said Letters Patent is hereby corrected as shown below:

Column 10, lines 8-15 (cont'd):

1 1 1 0 0 1 1 0 1 X X X X   (3) 13-bit encoded TCAM word (padded)"

Should read

--1 0 1 1 1 0 1 1 1 1 0 0    (4) 12 bit comparand, top 8 prefix matches (1)

1 1 1 1 1 1 1 1 0 1 1 1      (5) single bit "AND" mask for 8 bit prefix 1 0 1 1 1 0 1 1 0 1 0 0   (6) column-wise "AND" of (4) and (5)

1 0 1 1 1 0 1 1 0 1 0 0      (7) is (6) shifted right by 1 bit 1 1 1 0 0 1 1 0 1 1 1 0 0    (8) column-wise "XOR-WOR" of (6) and (7)

1 1 1 0 0 1 1 0 1 X X X X    (3) 13-bit encoded TCAM word (padded)--; and

Column 10, lines 27-35:

"1 0 1 1 0 0 1 1 1 1 0 0     (9) 12 bit comparand 1 bit different to (4)

1 1 1 1 1 1 1 1 0 1 1 1   (10) single bit "AND" mask for 8-bit prefix 1 0 1 1 0 0 1 1 0 1 0 0   (11) column-wise "AND" of (9) and (10)

1 0 1 1 0 0 1 1 0 1 0 0   (12) is (11) shifted right by 1 bit 1 1 1 0 1 0 1 0 1 1 1 0 0 (13) column-wise "XOR-WOR" of (11) and (12)

1 1 1 0 0 1 1 0 1 X X X X    (3) 13-bit encoded TCAM word (padded)

0 0 0 0 1 1 0 0 0 0 0 0   (14) mismatched bits between (13) and (3)"

Should read

--1 0 1 1 0 0 1 1 1 1 0 0    (9) 12 bit comparand 1 bit different to (4)

1 1 1 1 1 1 1 1 0 1 1 1      (10) single bit "AND" mask for 8-bit prefix

UNITED STATES PATENT AND TRADEMARK OFFICE
CERTIFICATE OF CORRECTION

PATENT NO. : 7,243,290 B2
APPLICATION NO. : 10/616958
DATED : July 10, 2007
INVENTOR(S) : Keith R. Slavin It is certified that error appears in the above-identified patent and that said Letters Patent is hereby corrected as shown below:

Column 10, lines 27-35 (cont'd):

| | |
|---|---|
| 1 0 1 1 0 0 1 1 0 1 0 0 | (11) column-wise "AND" of (9) and (10) |
|   1 0 1 1 0 0 1 1 0 1 0 0 | (12) is (11) shifted right by 1 bit |
| 1 1 1 0 1 0 1 0 1 1 1 0 0 | (13) column-wise "XOR-WOR" of (11) and (12) |
| 1 1 1 0 0 1 1 0 1 X X X X | (3) 13-bit encoded TCAM word (padded) |
| 0 0 0 0 1 1 0 0 0 0 0 0 0 | (14) mismatched bits between (13) and (3)--. |

Column 12, lines 47-48, "an miscellaneous" should read --a miscellaneous--;

Column 12, line 49, "an legacy" should read --a legacy--;

Column 12, line 50, "also coupled" should read --also be coupled--;

Column 12, line 60, "an local" should read --a local--;

Column 12, line 64, "an universal" should read --a universal--;

Column 12, line 65, "via to the" should read --via the--; and

Column 13, line 1, "to one additional" should read --to additional--.

In the Claims, the following errors are corrected:

Claim 15, column 14, line 54, "hierarchical of" should read --hierarchical--; and

UNITED STATES PATENT AND TRADEMARK OFFICE
CERTIFICATE OF CORRECTION

PATENT NO. : 7,243,290 B2
APPLICATION NO. : 10/616958
DATED : July 10, 2007
INVENTOR(S) : Keith R. Slavin It is certified that error appears in the above-identified patent and that said Letters Patent is hereby corrected as shown below:

In the Claims, the following errors are corrected (cont'd):

Claim 30, column 16, line 24, "encode" should read --encoded--.

Signed and Sealed this

Twenty-third Day of October, 2007

JON W. DUDAS
*Director of the United States Patent and Trademark Office*